(12) United States Patent
Loh et al.

(10) Patent No.: US 8,381,148 B1
(45) Date of Patent: Feb. 19, 2013

(54) FORMAL VERIFICATION OF DEADLOCK PROPERTY

(75) Inventors: Lawrence Loh, Milpitas, CA (US); Xiaoyang Sun, Singapore (SG)

(73) Assignee: Jasper Design Automation, Mountain View, CA (US)

( * ) Notice: Subject to any disclaimer, the term of this patent is extended or adjusted under 35 U.S.C. 154(b) by 0 days.

(21) Appl. No.: 13/404,403

(22) Filed: Feb. 24, 2012

Related U.S. Application Data

(63) Continuation of application No. 13/287,077, filed on Nov. 1, 2011, now abandoned.

(51) Int. Cl.
*G06F 17/50* (2006.01)
(52) U.S. Cl. .......... 716/106; 716/111; 716/136; 703/16
(58) Field of Classification Search ............ 716/106, 716/111, 136; 703/16
See application file for complete search history.

(56) References Cited

U.S. PATENT DOCUMENTS

| | | | |
|---|---|---|---|
| 8,131,768 B2* | 3/2012 | Sinha | 707/792 |
| 2003/0159124 A1* | 8/2003 | Fisher | 716/18 |
| 2007/0160323 A1* | 7/2007 | Deliwala | 385/28 |
| 2009/0281999 A1* | 11/2009 | Sinha | 707/3 |
| 2009/0292941 A1* | 11/2009 | Ganai et al. | 714/2 |

* cited by examiner

*Primary Examiner* — Phallaka Kik
(74) *Attorney, Agent, or Firm* — Fenwick & West LLP

(57) ABSTRACT

A verification system determines proof of the absence of a deadlock condition or other data-transport property in a multi-system SoC using helper assertions derived from a transaction definition. The verification system receives the circuit design information along with a transaction definition for one or more ports of the SoC. Once specified, the transaction definition is instantiated into the full system or subsystem RTL, generating an expanded RTL and a deadlock property. Data flow through the RTL is analyzed to extract helper assertions describing how the data flowed through the RTL. Helper assertions are automatically extracted to aid in the verification of the absence of a deadlock condition. Using the helper assertions, the formal engine applies one or more techniques to formally analyze the circuit design to prove the absence of a deadlock condition.

35 Claims, 5 Drawing Sheets

FORMAL VERIFICATION OF DEADLOCK PROPERTY

CROSS REFERENCE TO RELATED APPLICATIONS

This is a continuation of U.S. application Ser. No. 13/287,077, entitled "Formal Verification of Deadlock Property," filed on Nov. 1, 2011, which is incorporated by reference in its entirety.

BACKGROUND

This present disclosure relates generally to formal verification of circuit designs, and more particularly to formal verification methods of verifying deadlock conditions in multi-system circuits.

Highly-integrated complex system-on-chip (SoC) devices power a wide range of systems, ranging from mobile computing devices to automotive control systems. One factor aiding the advancement and proliferation of these complex devices includes the use of readily available reusable semiconductor intellectual property (IP). Reusable semiconductor IP provides designers with a variety of silicon proven subsystem blocks, including processors, memory controllers, physical interfaces (PHYs), and input/output (I/O) circuits. But the integration of reusable semiconductor IP also adds to the growing challenges facing design verification engineers.

Multisystem SoCs present complex system issues that can be difficult and time consuming to identify and solve, even for experienced design verification engineers. These issues include verifying that multiple subsystems operate as a system and stressing subsystem interfaces to fully characterize and verify transaction flow between subsystem modules. While verification tools have improved, current verification methods still require significant expertise and experience to quickly identify and debug complex interface and interconnect problems. And, in many cases, verification tools lack the capability to interact with verification engineers in a manner to leverage their expertise to address this complexity.

To improve system-oriented SoC verification, what are needed are techniques that leverage information from individual pieces in verifying global behavior of the system, and also leverage collaborative interaction with the verification engineer to aid in the identification and resolution of complex interface and interconnect problems associated with multi-system SoCs.

SUMMARY

Embodiments of the present disclosure determine proof of the absence of a deadlock condition or other data-transport property in a multi-system SoC based in part on helper assertions derived from a transaction definition. The verification system receives the circuit design information along with a transaction definition for one or more ports of the system. Once specified, the transaction definition may be instantiated into the full system or subsystem RTL, generating an expanded RTL and a deadlock property. The data flow through the RTL may be analyzed to extract helper assertions describing how the data flowed through the RTL. In some embodiment, helper assertions may be automatically extracted to aid in the verification of the absence of a deadlock condition. In other embodiments, the generated helper assertions by interacting with a user to distinguish between intentional (RTL feature) and unintentional (RTL bug) droppage of pending transactions. Aided by the helper assertions, the formal engine may apply one or more techniques to formally analyze the circuit design to prove the absence of a deadlock condition.

The figures depict various embodiments of the present disclosure for purposes of illustration only. One skilled in the art will readily recognize from the following discussion that alternative embodiments of the structures and methods illustrated herein may be employed without departing from the principles of the embodiments described herein.

DETAILED DESCRIPTION

Overview

Embodiments of the present disclosure determine proof of the absence of a deadlock condition in a full system or a subsystem of a multi-system SoC based in part on helper assertions derived from a transaction definition. Some of the techniques are also applicable to formal verification of properties other than deadlock, such as a data-transport related property that track data movement from payload to payload, making sure data is not corrupted or lost, etc. The verification system receives the subsystem circuit design information, such as an RTL description, along with a transaction definition for one or more ports of the subsystem. The transaction definition may, for example, specify a deadlock condition associated with one or more active ports of the subsystem. Typically, the transaction definition may be coded to specify an unbounded latency, or a very large bounded latency, and similarly for the conceptual deadlock condition. Once specified, the transaction definition may be instantiated into the full system or subsystem RTL, generating an expanded RTL and a deadlock property. To improve the efficiency of formal analysis of the deadlock condition, one embodiment of the present disclosure converts the conceptual deadlock condition into a condition with a small bounded latency.

Furthermore, the expanded system or subsystem RTL, or its underlying individual blocks may be analyzed based on the deadlock property to generate helper assertions. In many cases, the disclosed embodiments automatically extract helper assertions to aid in the verification of the absence of a deadlock condition. In some cases, such as when a transaction could be intentionally dropped, the generation of helper assertions can be augmented by providing the helper assertions to an interactive helper assertion generator for the user to distinguish between intentional (RTL feature) and unintentional (RTL bug) droppage of pending transactions. Aided by the helper assertions, the formal engine can apply one or more techniques, such as induction, theorem proving, or design space tunneling to formally analyze the expanded RTL to prove the absence of a deadlock condition. And to further exhaust test coverage, automatically generated helper assertions may be further optimized by identifying the behavior of relevant signals using waveform analysis.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

Deadlock Verification System

Figure 1:
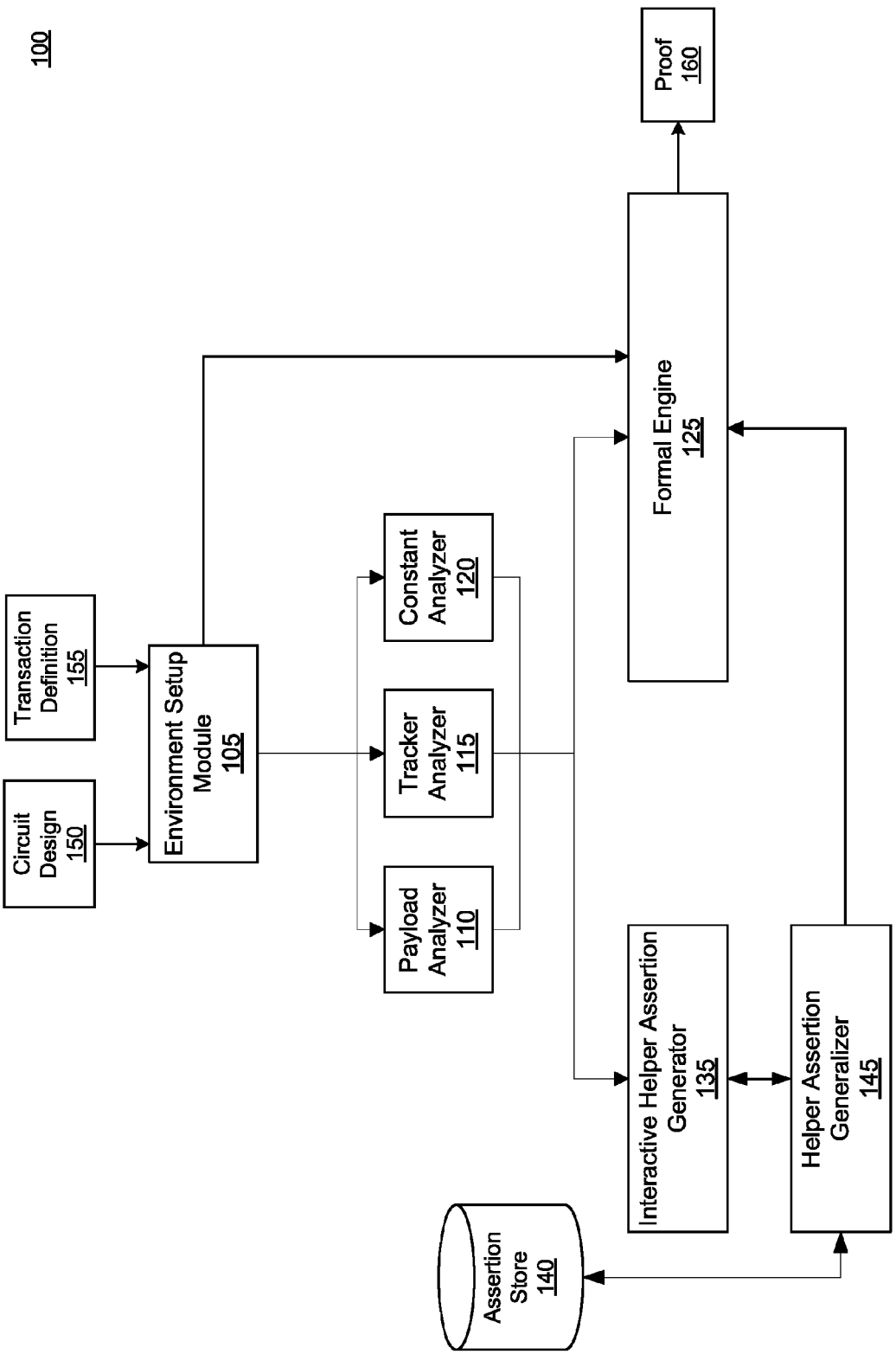
FIG. 1 illustrates a system diagram of an exemplary verification system for proving the absence of a deadlock condition in accordance with an embodiment.

FIG. 1 illustrates a system diagram of an exemplary verification system 100 for proving the absence of a deadlock condition in accordance with an embodiment. The verification system 100 may include among other components, environment setup module 105 coupled to receive circuit design 150 and transaction definition 155, payload analyzer 110, tracker analyzer 115, constant analyzer 120, formal engine 125 to generate proof 160, interactive helper assertion generator 135, helper assertion store 140, and helper assertion generalizer 145.

The environment setup module 105 is configured to receive the verification environment information, to associate an register transfer level (RTL) file list with verification intellectual property (VIP) corresponding to the transaction definition 155, and to arrange general setup information describing the setup environment. The transaction definition 155 may be provided by instantiating VIP into the subsystem RTL. The output of the environment setup module 105 is often an expanded RTL instantiated with the verification IP, and including a property corresponding to the transaction definition 155. Consistent with the disclosed embodiments, the property corresponding to the transaction definition 155 may be a deadlock property. The general setup information may be output as a tool command language (Tcl) setup file.

The verification environment may include circuit design 150, transaction definition 155, clock and reset signals, valid signals, data bus, and other information suitable to setup the formal environment. The circuit design 150 may be embodied in a data file encoded using a hardware description language (HDL) written in an register transfer level (RTL) file list, which may describe the structural design and operation of a circuit. A set of requirements is derived from a design specification for the circuit and then used to test whether the circuit design is compliant with the design specification. A user, such as a circuit designer or a verification engineer, may supply the requirements for the circuit design.

In some embodiments, the requirements specify the absence of a deadlock condition on one or more ports of the subsystem. Generally, a deadlock condition occurs when two or more processes fail to complete because each of process continues to wait for the other process to complete or to release a resource. Deadlock conditions may arise more frequently in complex multi-system configurations, such as those illustrated in FIGS. 3A-3B. Returning to FIG. 1, the requirements may be encoded in a transaction definition 155 as one or more properties and/or assumptions for the circuit design 150, encoded for example using Property Specification Language (PSL) or SystemVerilog Assertion (SVA). The transaction definition 155 may be directly coded by a user or captured in an automated process. A property may be represented in the transaction definition 155 as an assertion, where the assertion is satisfied if the property is true for all operating conditions of the circuit design 150. For example, in some embodiments the transaction definition describing a deadlock property may be included in setup verification IP (VIP) coded as follows:

```
module deadlock_forward_progress (clk, rst, event_I,
    event_O, stall, event_D, latency);
parameter NUM_IN=4;
parameter NUM_OUT=4;
parameter TRANS_QUEUED=32;
parameter CNT_WDTH=$clog2(TRANS_QUEUED);
input clk, rst;
input [NUM_IN-1:0] event_I; //a transaction is enqued
input [NUM_OUT-1:0] event_O; //a transaction is
    dequeued
input [NUM_DROP=1:0] event_D; //a transaction is intentionally dropped
input stall; //intentional system stalls
endmodule
```

This exemplary Verilog module may be instantiated and connected to the circuit design 150. As the user instantiates this module with the appropriate connection to the inputs, the tool receives the following information regarding the design: (1) clock signal in the circuit design 150; (2) the reset signal in the circuit design 150; (3) the maximum of NUM_IN transactions initiated at each clock cycle, and whether such events occur at any given cycle; (4) the maximum of NUM_OUT transactions exiting at each clock cycle, and whether such events occur at any given cycle; (5) the maximum of NUM_DROP transactions being dropped at each clock cycle, and whether such events occur at any given cycle; and (6) there can be a stall in which no transaction can exit and whether such events occur at any given cycle. As a verification IP, this module can be encrypted. As such, knowledge of the interface and instantiation of the module with proper connection to the RTL is sufficient to practice the disclosed embodiments, without an understanding of the internal operation of the VIP module.

In the above example, transaction definition describes a deadlock property, defined based on forward progress. A general deadlock verification is often captured as a liveness property tracking a specific transaction entering and exiting the circuit design 150, and therefore may involve analyzing the circuit design 150 for an infinite number of cycles. To improve the efficiency of the formal analysis performed by the formal engine 125, the transaction definition may include a finite latency. For example, the transaction definition 155 may further include: "input [7:0] latency;". This describes a latency threshold as the longest congested latency for new activity to appear on an egress port; i.e., if no contention among ports, the longest sequential path from any input to any output. This information is optional since the disclosed embodiments may attempt to either extract the latency from the RTL, or empirically try out different latencies to see which one allows a formal proof of the property. Furthermore, the verification IP may have another optional information from the RTL: "input action;". This signal, may be connected to the RTL so that it is asserted whenever the RTL has internally made any forward progress in any transaction, and therefore allow the verification to use an even smaller latency. This transaction definition 155 allows a deadlock condition to be described as the absence of a transaction exiting the circuit design 150 (or the lack of forward progress indicated by the "action" signal) within a threshold period of time, without tracking the same transaction entering and exiting the design. In a later section, we will describe how a concrete deadlock property can be implemented in this verification IP, and how such a deadlock property removes the need to track a specific transaction from entering the design to exiting the design, and also changes the verification problem from infinite to a small finite number of cycles for which a transaction may exit in the circuit design 150.

Although not shown, other environment setup information may include other properties, such as cover and assumption. A cover is satisfied if the property is true for some operating condition of the circuit design 150. An assumption may specify that certain input signals to the circuit design may only take on pre-determined values (i.e., 0 or 1) at certain clock cycles when testing the circuit design against the property.

Figure 2:
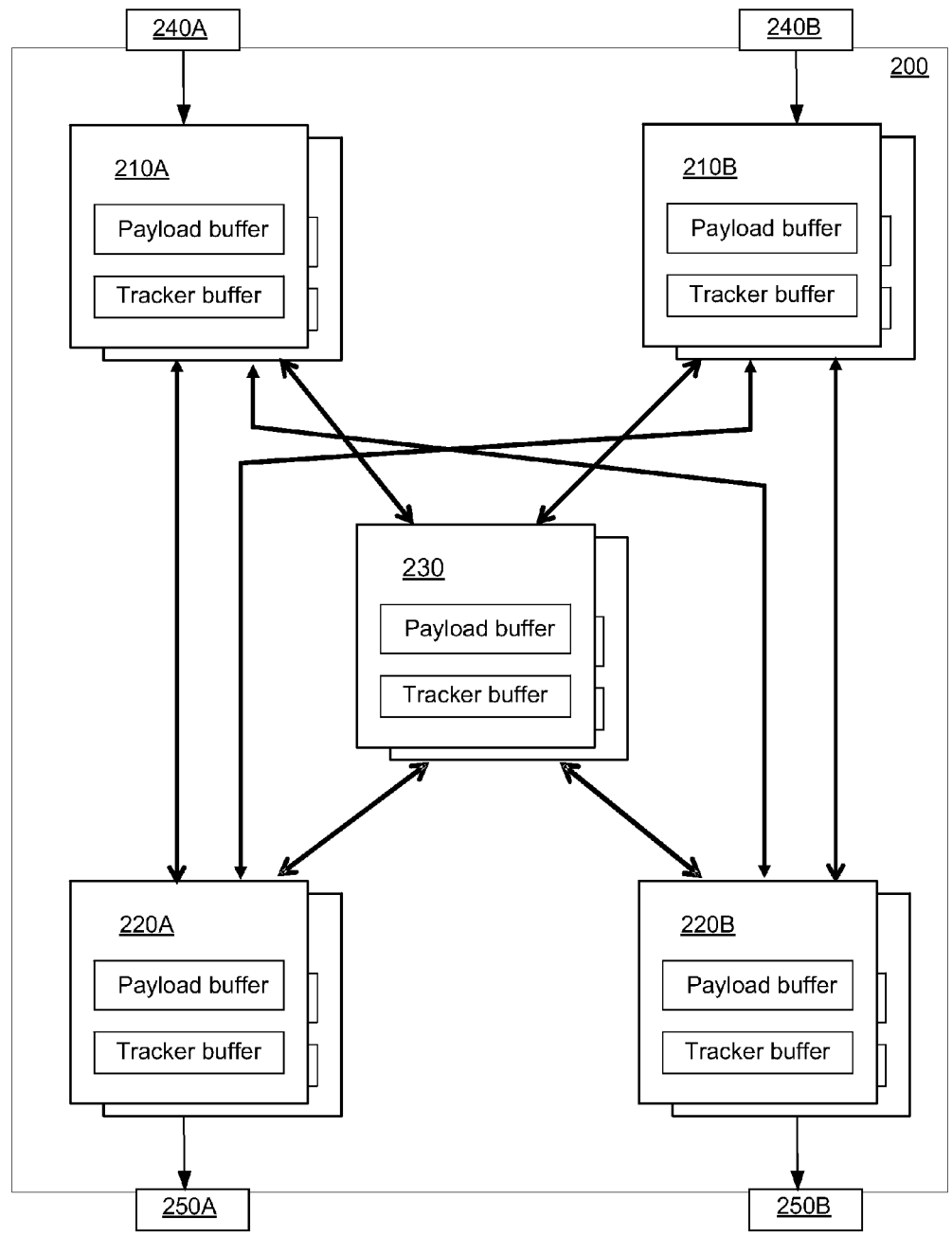
FIG. 2 illustrates a block diagram of an exemplary subsystem module in accordance with an embodiment.

In other embodiments, the environment setup module may receive additional setup configuration information describing the normal functionality of multiple subsystems or blocks are connected together to form the full system or subsystem in the circuit design 150. For example, to verify the absence of a deadlock condition on a interconnect subsystem, each interconnect block may be specified as having two pairs of master-slave ports. Each master port being an ingress port, and each slave port being an egress port, as shown in FIG. 2. Additional setup configuration information may also include valid signals, data bus, etc., commonly specified for an interface. For example, a standard AMBA AHB interface may contain the signals HADDR (to capture the address of the memory to be accessed), HRDATA (to capture the data in the reply to a read request), HREADY (to indicate whether a transfer has finished in the bus). In the example described above, this interface information may be used to determine the payload buffers in the design, by looking at the logic connected to the HRDATA for the transaction data, and looking at the logic connected to HREADY for valid bit manipulation of the payload.

The payload analyzer 110 is configured to receive the output of the environment setup module 105 and provide helper assertions to the formal engine 125 and trace information to the interactive helper assertion generator 135. Specifically, the payload analyzer 110 is configured to analyze how data flows through the expanded subsystem RTL based on the received deadlock property and transaction definition to generate helper assertions.

In some embodiments, the payload analyzer 110 may operate statically on each single subsystem or block separately to reduce the time to generate appropriate helper assertions. The payload analyzer 110 is further configured to detect the payload buffers, for example b, b1, b2, etc., storing the transaction, starting from the data bus in an interface, and working forwards and backwards to detect the datapath. It also detects when the valid signal related to the payload buffer can transition from a value of "0" (indicating an invalid signal) to a value of "1" (indicating a valid signal). The payload analyzer 110 may also be configured to extract corresponding properties, such as exemplary property b.valid && condition_b1|=>!b.valid && b1.valid, where "condition_b1" describes the condition in which the transaction stored in b is transferred to b1. (Note that the present disclosure uses SystemVerilog Assertion syntax in our examples, i.e. |=> represents delayed implication and |→ represent immediate implication, etc.) Accordingly, enumerating all paths to which the data might be passed from b generates the possible conditions where the data moves from b, including condition_b1, condition_b2, condition_b3, . . . , etc. In this example, verification of "b.valid ##1~b.valid|→condition_b1|condition_b2 . . . " determines whether there is any way data might be lost and not passed correctly to a receiving buffer. The extracted properties provide helper assertions on the payload, which can be used by the formal engine 125 to prove the absence of a deadlock condition. In some embodiments, the payload analyzer 110 may also output trace information, such as waveforms or text listings, to interactive helper assertion generator 135 to create payload related helper assertions.

The payload analyzer 110 may generate a list of payload data and associated payload control signals. For example, as shown below in set PL0, payload analyzer 110 may output a list of current payload control and payload data set and previous payload and control set.

```
Set PL0 {
    {
        {pl_curr_sta[0] {pl_curr_fifo[0][3:0] pl_curr_fifo[0][17:10]}
        {pl_curr_sta[1] {pl_curr_fif0[1][3:0] pl_curr_fifo[1][17:10]}
    }
    {
        {pl_prev_valid_a {req_a[29:26], reg_a[20:12]}}
        {pl_prev_valid_b {reg_b[29:26], reg_b[20:12]}}
    }
}
Set PL0_propagate {
    { pl_prev_valid_a pl_curr_sta[0] {pl_sel[1:0] 2'b01}
    {pl_curr_index 1'b0} tx_issued_expr }
    { pl_prev_valid_a pl_curr_sta[1] {pl_sel[1:0] 2'b01}
    {pl_curr_index 1'b1} tx_issued_expr }
    { pl_prev_valid_b pl_curr_sta[0] {pl_sel[1:0] 2'b10}
    {pl_curr_index 1'b0} tx_issued_expr
    { pl_prev_valid_b pl_curr_sta[1] {pl_sel[1:0] 2'b10}
    {pl_curr_index 1'b1} tx_issued_expr }
    ...
```

The previous payload control and data set may be analyzed by payload analyzer 110 based on current payload control and data set. The initial payload control and data set may be included in the setup environment information. The payload control and data set includes the valid signal and the payload data signals. In some embodiments, the payload signal data may have more than one field, like ID, ADDR, etc. In set of PL0_propagate, lists the control signals when the payload is propagated from previous step to current step. The previous payload and current payload is represented by the valid signal. Following the pair of the valid signal, the first {sig val} pair represents the signal and value to control which previous payload to be propagated downstream. The second pair of {sig val} represents the signal and value to control which current payload to store the payload propagated. The "tx_issued_expr" represents the expression when the propagation happens. The generated list of payload data and associated payload control signals may be confirmed or further modified responsive to a user interaction. Based on the confirmed/modified result, the payload analyzer may generate the "payload" related helper assertions. For example, a helper assertion may be in the form of when payload propagation happens, the design will always propagate a valid payload from previous step to current step, as shown in the following assertion:

```
assert -name help1 {
    tx_issues_expr && (pl_sel[1:0] == 2'b01) |->
        (pl_prev_valid_a == 1'b1)
    }
```

Once generated, payload helper assertions may be provided to a user for verification.

The tracker analyzer 115 is configured to receive the output of the environment setup module 105 and provide tracker related helper assertions to the formal engine 125 and corresponding trace information to the interactive helper assertion generator 135. Specifically, the tracker analyzer 115 analyzes how the current state of the logic next to a payload tracks the progress of the transaction that has been passed onto the next stage of the logic. In some embodiments, tracker analyzer 115 may analyze this information automatically by analyzing the fanout of the logic that controls the forward progress of the payload. It may also utilize "relevant fanout" only, detecting the signals relevantly determined by the payload signals, as described in U.S. Pat. No. 7,437,693, which is hereby incorporated by reference. In some embodiments, the tracker analyzer 115 may also output trace information, such as waveforms or text listings, to interactive helper assertion generator 135 to create tracker related helper assertions.

The constant analyzer 120 is configured to analyze the expanded RTL configuration and disabled ports, to analyze the logic that manages values of active ports, and to output a Tcl file with a list of helper assumptions for the specified constant signals. Many SoCs contain duplicate or similar components. For example, interconnect RTL typically contains a plurality of master ports and slave ports. To further optimize the process of formal analysis, one embodiment receives RTL configuration to turn off a subset of the ports, and to generate helper assertions that captures how various parts of the RTL logic behave when these ports are disabled. The constant analyzer 120 propagates constraints regarding how some ports on interface are disabled, and detect which internal logics would be quiet forever, providing the basis for generating helper assertions.

It has been observed that most properties, if found to be true in a scaled down RTL, with two or three ports, depending on the protocol, are also true in the original RTL with many ports. And due to symmetry, if a deadlock cannot occur and cause transactions to stop coming out of one port, the same would be true for the other port. However, instead of using a formal engine that understands symmetry reduction, the disclosed embodiments generate constant helper assertions corresponding to RTL configuration that disables a subset of the ports.

The interactive helper assertion generator 135, as previously discussed, interacts with a user to optimize helper assertions output by the payload analyzer 110, the tracker analyzer 115, and the constant analyzer 120, which may be further processed by the formal engine 125 to verify the absence of a deadlock condition. In operation, the interactive helper assertion generator 135 may present waveforms and/or text listing to the user in an interactive manner. For example, in some embodiments the waveforms or portions of a waveform may be color-coded, highlighted, or selectable in a manner to highlight important behaviors for the interactive helper assertion generator 135 to capture helper assertions. The waveform presented is often a completed transaction propagation, completed with respect to the current logic being analyzed, which could be just one block within a subsystem, a subsystem within the full system, or, less likely, but even the full system. It captures the transaction starting from the original request to the current logic and ends up until the request is responded back to the original source or is passed on to other logic not currently being analyzed. For example, if there is an AR request flows into ingress port, the waveform will show the transaction propagates to its destination egress port and sent out. Then the RD response will come back from outside and propagate from the egress port to the original ingress port and sent out. The signals in RTL with relevant transitions will be presented as a waveform, with the definition of relevant transitions using a similar technique as the one described in U.S. Pat. No. 7,137,078, which is hereby incorporated by reference. The payload and tracker signals output by the payload analyzer 110, the tracker analyzer 115 will be highlighted in different colors. When a payload signal has a transition from invalid state to a valid state, the transition cycle in waveform will be highlighted, which indicates a transaction has entered the payload. When a payload signal has a transition from valid state to invalid state, the transition cycle in waveform will be highlighted, which indicates a transaction is propagated downstream. When a tracker signal has transition, it will be highlighted, which means the tracker tracks a transaction propagated downstream, or a corresponding response transaction received. Take the helper assertion in [0045] as example, user may see a waveform at T+N1 cycle, "In1.ar_r_traker.valids[0]" become 1'b1 and "e1.arch.valid_a" becomes 1'b1. At T+N2 cycle, "e1.ar_r_tracker.valids[0]" become 1'b1 and "e1.arch.valid_a" becomes 1'b0. At T+N3 cycle, "e1.ar_r_tracker.valids[0]" becomes 1'b0 and "in1.rch.valid_a" becomes 1'b1. At T+N4 cycle, "In1.ar_r_traker.valids[0]" become 1'b0. Here it is assumed that N1<N2<N3<N4. When the payload signals mentioned above are valid, it means the transaction between the two trackers are on the road.

Furthermore, the productivity of reviewing such waveforms from formal analysis can be highly simplified by creating a waveform with minimal activities that still illustrate a completed transaction, using the QuietTrace technology as described in co-pending U.S. patent application Ser. No. 12/961,389, which is hereby incorporated by reference. A trace based design navigation, as described in U.S. Pat. No. 7,137,078, which is hereby incorporated by reference, can be applied recursively to determine the signals relevant in the fanin cone with respect to the completed transactions, and the QuietTrace technology can be used to make such identification even more effectively due to the reduced set of relevant signals.

The helper assertion generalizer 145 may be configured to receive helper assertions from interactive helper assertion 135, and analyze the expanded RTL associated with the circuit design 150 to identify similar helper assertions to be added to a helper assertion store 140. The helper assertion store 140 may be one or more databases. The database may be a structured collection of tables, lists, or other data. As such, the structure may be organized as a relational database or an object-oriented database. The database may also be a hardware system comprising tangible computer readable storage media and input and/or output devices configured to provide read and/or write access to content information stored therein. Consistent with the disclosed embodiments, information may be stored and organized in the helper assertion store 140 as tables, lists, or other data structures associated with the received items.

In some embodiments, the generated assertions, if known to be true based on local formal analysis, may be directly added to the helper assertion store 140. If there is any uncertainty as to whether the generated assertion is known to be true based on local formal analysis, the generated assertions are passed to the interactive helper assertion generator 135 as candidates to receive confirmation or adjustment from the user.

In one embodiment, the helper assertion generalizer 145 searches for duplicate instances of the same submodule. If a helper assertion captures the relationship of the signals within one instance, a similar helper assertion may be generated for the other instances as well and stored in helper assertion store 140. If a helper assertion captures the relationship of the signals among two instances, similar helper assertion among other pairs of instance will be generated. Similarly, for helper assertions on a specific bit of a bus, similar assertions for the other bits might be useful, depending on whether the bus is symmetrical or not. In another embodiment, the helper assertion generalizer 145 analyzes how the transaction flows from payload to payload. If there is a helper assertion on payload A, relating the with the bits within payload A, and payload B receives transactions from payload A, then a similar helper assertion on payload B, relating the bits within payload B, may be useful. As the control flow for the transfer of transactions in payload A to payload B gets more complicated, some transformation of the helper assertions when applied to payload B may be needed, and in such cases, passing the generalized helper assertions back to the interactive helper assertion generator 135 may avoid feeding inappropriate helper assertions to the assertion store 140.

In a formal verification process, the formal engine 125 receives the output of environment setup module 105, which includes an expanded RTL associated with circuit design 150 and transaction definition 155, and formally verifies the circuit design 150 for absence of a deadlock condition. The formal engine 125 may convert the output of environment setup module 105 into an internal representation using one or more data structures, such as a netlist. This conversion may comprise two different conversions: (1) synthesis of the input circuit design 150, and (2) property compilation of the properties in the transaction definition 155.

The results of the design synthesis and the property compilation are then combined into a common problem instance that is given as input to a model checker in the formal engine 125. The formal engine 125 then performs formal verification on the circuit design 150 using the statically allocated data structure. For assertions, during the formal verification process, the model checker attempts to determine whether there is a possible behavior of the circuit design 150 where one of the properties in the transaction definition 155 are not true, which is called a counterexample for the property. If it is determined that no counterexample exists for a property, the property is said to be proven. Consistent with the disclosed embodiments, the formal engine may utilize commonly known techniques to determine whether a property is proven. In other embodiments, to more efficiently determine whether a property is proven, formal engine 125 may utilize helper assertions generated by payload analyzer 110, tracker analyzer 115, and constant analyzer 120, or any helper assertion deemed appropriate by the user in the assertion store 140. For example, formal engine 125 may use inductive methods, such as an induction engine that performs a backward analysis from the failing state, along with helper assertions to determine if the backward analysis fails to reach a legal state. Other formal engine techniques, consistent with the disclosed embodiments, may include theorem proving that utilize helper assertions as lemma to support the proof of deadlock properties. Further formal engine techniques may include design space tunneling engine, described in U.S. Pat. Nos. 7,020,856 and 7,065,726, both of which are hereby incorporated by reference, along with helper assertions to reduce the amount of logic for formal analysis of the deadlock properties.

FIG. 2 illustrates a block diagram of an exemplary subsystem module 200 in accordance with an embodiment. Because many multi-system SoCs are highly symmetrical, the subsystems comprising the larger system are often highly symmetrical. Accordingly, the disclosed embodiments utilize the symmetry of the device under test 200 to reduce the complexity of formal analysis, by simplifying the device under test to a subsystem having two pairs of master-slave ports. As shown in FIG. 2, the subsystem module 200 includes a first pair of master-slave modules that includes master module 210A and slave module 220A, coupled to master port 240A and slave port 250A, respectively. A second pair of master-slave ports includes master module 210B and slave module 220B, coupled to master port 240B and 250B. Subsystem module 200 further includes internal module 230, coupled propagate transactions between the pairs of master-slave ports. If other ports exist, they can often be configured to be disabled for the purpose of verifying deadlock and or other properties, due to symmetry reason.

In some embodiments, the subsystem module 200 may be an interconnect configured to propagate a transaction between multiple ingress ports—master ports 210A and 210B, and multiple egress ports—slave ports 220A and 220B. Transactions may propagate through the subsystem module 200 in accordance with a protocol, including, but not limited to, AMBA, AXI, ACE, AXI, AHB, APB, or other on-chip interconnect specifications suitable for the connection and management of functional blocks in a SoC. The internal module 230 may be any internal module, such as an arbitrator, configured to receive transactions from one or more ingress ports and forward the transactions to one or more egress ports in accordance with a protocol specification.

Consistent with the disclosed embodiments, modules included in subsystem module 200 include payload and tracker buffers. Payload buffer may be a suitable structure for storing payload data as previously described. Generally, the payload buffer may be a storage buffer configured to store the transaction control or data information. For example, the payload buffer may be a ping-pong registers, First-In-First-Out (FIFO), Last-In-First-Out (LIFO), multiple entries registers array, or other storage structure suitable to store the payload data. The payload buffer may further be associated with additional RTL signals referred to a payload control signals to indicate whether the payload buffer is occupied. In operation, payload data may be propagated in the expanded RTL one level at a time. For example, in some embodiments there are two levels of payload, represented as M×N, where payload data stored in M may be forwarded to next level N. To forward payload data, three sets of signal may be used, including: (1) a first signal to indicate which storage of M is valid (valid(M)), and a second signal to indicate which storage of N is valid (valid(N)); (2) a third signal to choose which storage of M is to be forwarded downstream (sel(M)); and (3) a fourth signal to indicate which storage of N is to store the payload forwarded from upstream (sel(N)).

Similarly, tracker buffer may be a suitable structure for storing trackers, such as buffer similar to payload buffer as previously described. Trackers may be simple or complex, like finite state machine (FSM). For example, master module 210A, may include a tracker of AW (write access channel) transaction to provide route information for WD (write data) transaction because the WD transaction does not include address information. Although FIG. 2 illustrates a single payload and tracker buffer to each module included in subsystem module 200, each module may include many payload buffer and trackers.

Figure 3A:
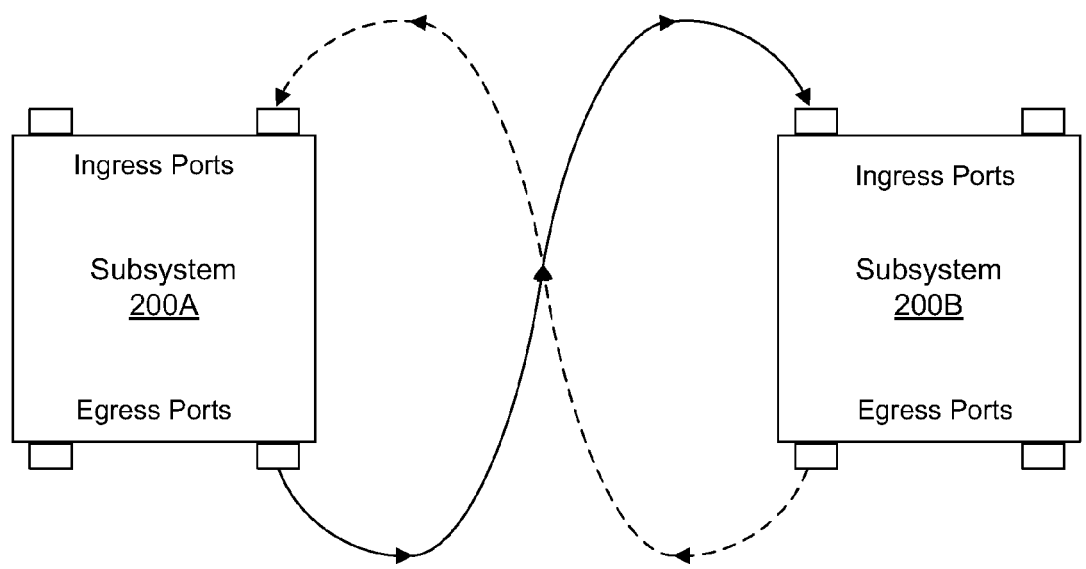
FIGS. 3A-3B illustrates exemplary subsystem interconnect diagrams in accordance with an embodiment.

FIG. 3A illustrates an exemplary subsystem interconnect diagram in accordance with an embodiment. Generally, the likelihood of an occurrence of a deadlock condition within a multi-system SoC increases as the complexity of the interconnection scheme between modules increases. For example, FIG. 3A shows a first subsystem 200A connected to a second subsystem 200B in a butterfly configuration. Specifically, in connecting the subsystem modules, an egress port of subsystem 200A is coupled to send a transaction to an ingress port of subsystem 200B. Similarly, an egress port of subsystem 200B is coupled to send a transaction to an ingress port of subsystem 200A. The configuration shown in FIG. 3A is not intended to be limiting, in that more than two subsystem modules may be connected in a butterfly configuration. And, in connecting the subsystem modules, more than one pair of ingress-egress ports may be connected in a manner as described in FIG. 3A. An example of a deadlock in such a system with two subsystem 200A and 200B could be that subsystem 200A is waiting for a reply in the egress before it can reply to the request from the ingress, and similar subsystem 200B is waiting for a reply in the egress before it can reply to the request from the ingress. As used herein, an ingress port may also operate an egress port. And, similarly an egress port may also operate as ingress port. Because, many system are bi-directional, the operating mode of a particular port may be configured to operate as ingress port, egress port, or both, depending on the configuration.

Figure 3B:
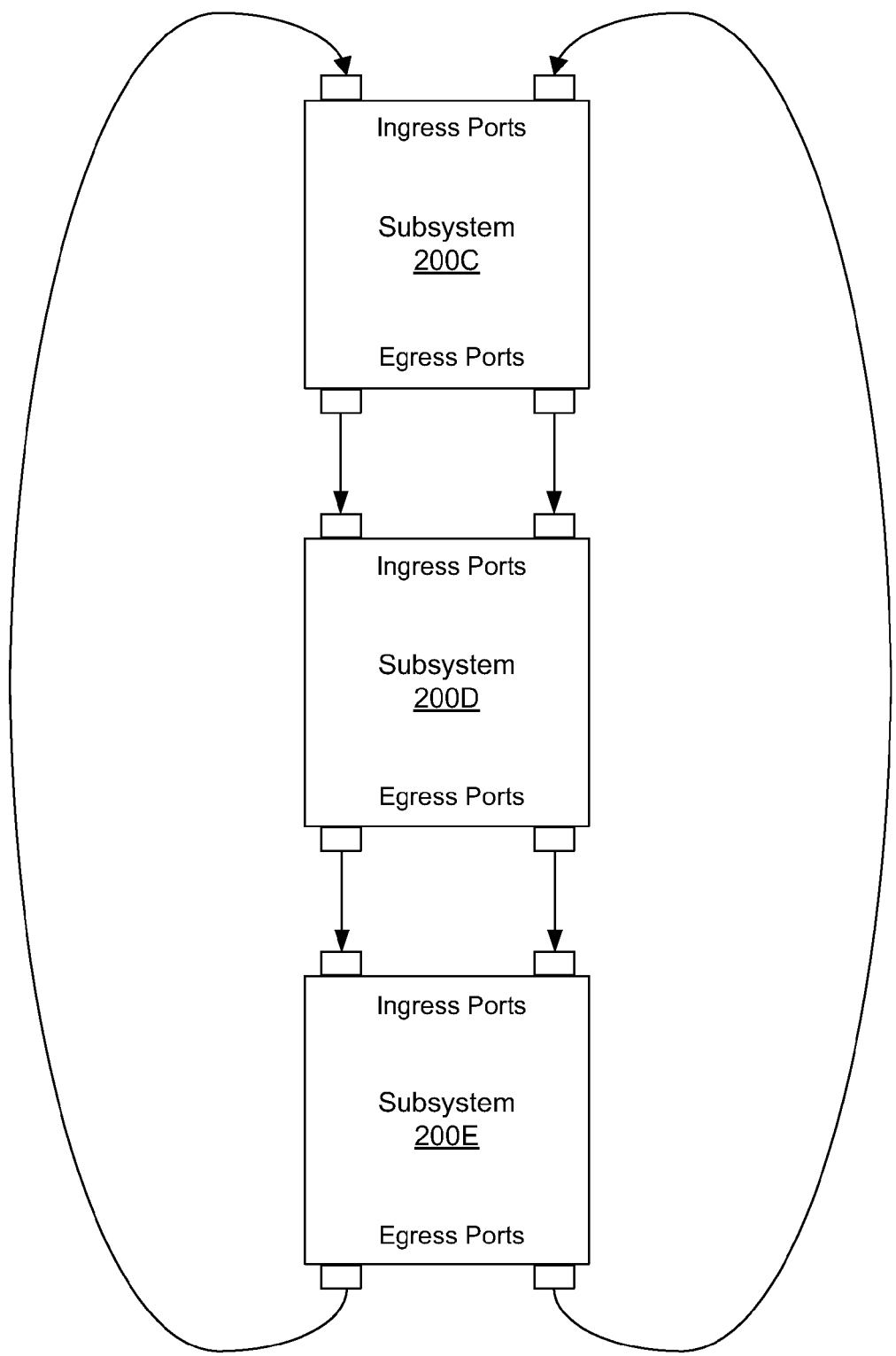

FIG. 3B illustrates another exemplary subsystem interconnect diagrams in accordance with an embodiment. For example, three or more subsystem modules may be connected in a ring configuration, as shown in FIG. 3B. The ring configuration may include two terminal subsystem modules, 200C and 200E, and at least one link subsystem module, 200D. As shown in FIG. 3A, the configuration includes two rings, the first ring formed by a first egress port of terminal subsystem module 200E, coupled to a first ingress port of the other terminal subsystem module 200C. The first egress port of the terminal subsystem module 200C is coupled to the first ingress port of link subsystem module 200D, and the first egress port of the link subsystem module 200D is coupled to the first ingress port of the terminal subsystem module 200E, completing the first link. The second ring is formed in a similar manner, where the second egress port of terminal subsystem module 200E, is coupled to a second ingress port of the other terminal subsystem module 200C. The second egress port of the terminal subsystem module 200C is coupled to the second ingress port of link subsystem module 200D, and the second egress port of the link subsystem module 200D is coupled to the second ingress port of the terminal subsystem module 200E, completing the second link.

Figure 4:
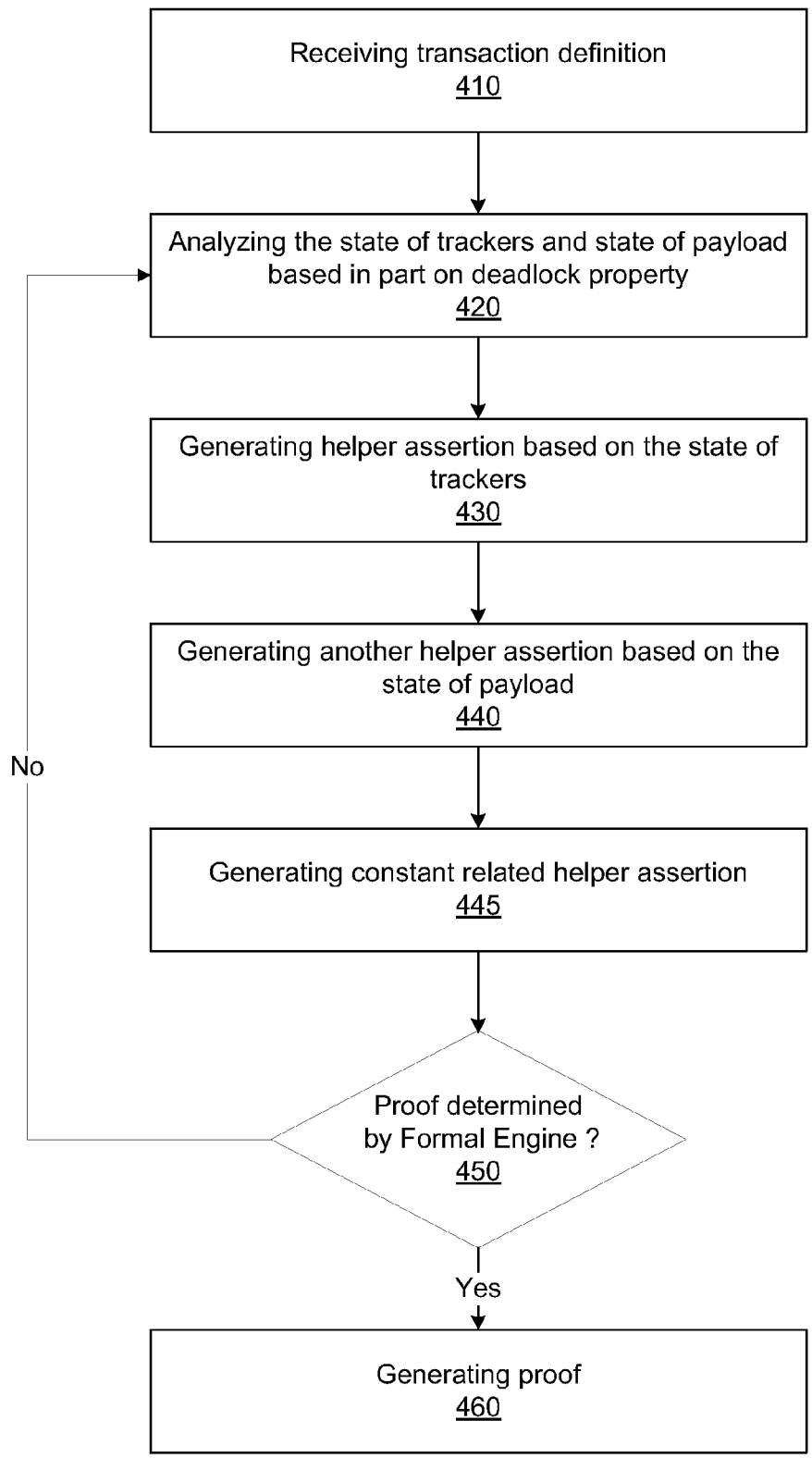
FIG. 4 illustrates a flowchart of an exemplary method for verifying a deadlock property in accordance with an embodiment.

FIG. 4 illustrates a flowchart of an exemplary method of a formal verification of deadlock property in accordance with an embodiment. The steps do not necessarily be executed in the specific order in the flow chart, and many of the steps are optional. The interactive helper assertion generator 135 and helper assertion generalizer 145 from FIG. 1 are not explicitly marked in this flowchart, but they could be used as part of steps 430, 440, and 450.

In step 410, the deadlock verification environment is received. For example, the formal verification tool may receive verification IP, RTL representation of the DUT, along with other common verification environment setup information as previously described. The formal verification environment, which may include a transaction definition, may be previously instantiated into the RTL prior to receipt by the formal verification tool.

In step 420, a deadlock property is generated based on the transaction definition described in the verification IP. The transaction definition included in the deadlock verification environment setup information is translated into a deadlock property. The deadlock property, as previously described, may include a finite latency and described as the absence of a transaction exiting the circuit design 150 within a threshold period of time, where the threshold period of time is specified as a latency cycle. For example, the deadlock property may be as follows:

```
logic [CNT_WDTH-1:0] outstanding_events; //transactions are still in
the system
always @(posedge clk)
    if (rst)
        outstanding_events <= { CNT_WDTH{1'b0}};
    else
        outstanding_events
            <= outstanding_events
            + $COUNTONE(event_I)
            - $COUNTONE(event_O)
            - $COUNTONE(event_D);
logic [7:0] time_lapse;         //Time since the last progress
    //If there is an output event, we reset the timer
    //If there is outstanding transaction, and the system is not stalling,
decrement the timer
    //Timer should not count down to 0 before a forward progress
event (event_D or event_O)
always @(posedge clk)
    if (rst)
        time_lapse <= latency;
    else if (action || event_O || event_D)
        time_lapse <= latency;
    else if (!stall && outstanding_events!={CNT_WDTH{1'b0}})
        time_lapse <= time_lapse - 8'd1;
property forward_progress;
    @ (posedge clk) disable iff (rst)
    (out_standing_events!=CNT_WDTH{1'b0} && !stall) |->
    time_lapse != 8'b0;
endproperty
assert_forward_progress: assert property (forward_progress);
```

In addition to generating a deadlock property, step 420 also generates an expanded RTL incorporating the circuit design 150 and the instantiated VIP.

In step 430, the state of the payload and trackers of the expanded RTL are analyzed based on the deadlock property to extract relevant payload and tracker signals and generate corresponding trace information, respectively related to the payload and the trackers. In operation, the payload analyzer 110 identifies the subsystem buffers that store payload data and the signals that control how data propagates from one subsystem buffer to another subsystem buffer. For example, verification system 100 may provide a function, such as "analyze_payload" to identify all payload of transaction in the expanded RTL. Responsive to executing the analyze_payload function, the payload analyzer 110 will choose AxID, DATA, and ADDR as payload data signals to trace the payloads in expanded RTL design. Further responsive to executing the analyze_payload function, the payload analyzer 110 will generate a list of payload data and associated payload control signals. The list may include a list of current payload control and payload data set and previous payload control and payload data set. The previous payload control and data set may be analyzed by payload analyzer 110 based on current payload control and data set. The initial payload control and data set may be included in the setup environment information. The generated list of payload data and associated payload control signals may be confirmed or further modified responsive to a user interaction with corresponding payload trace information.

In a similar manner, the tracker analyzer 115 is configured to analyze trackers and provide tracker related helper assertions and corresponding trace information. For example, tracker analyzer 115 may analyze trackers automatically by analyzing the fanout of the logic that controls the forward progress of the payload. For example, a load pattern, such as that described in U.S. Pat. No. 7,437,694, which is hereby incorporated by reference, may be used to isolate the portion of the logic relevant determined to be relevant based on the signal values controlling the transfer. In some embodiments, the tracker analyzer 115 may also output trace information, such as waveforms or text listings.

In step 440, payload related helper assertions are generated based on the state of the payload. Based on the confirmed/modified result, the payload analyzer may generate the "payload" related helper assertions. For example, a helper assertion may be in the form of when payload propagation happens, the design will always propagate a valid payload from previous step to current step, as shown in the following assertion:

```
assert -name help1 {
    tx_issues_expr && (pl_sel[1:0] == 2'b01) |->
        (pl_prev_valid_a == 1'b1)
}
```

Once generated, payload helper assertions may be provided to a user for verification.

Some designs, for example, may allow intentional droppage of transactions for various reasons. As a result, the payload analyzer would discover the conditions for payload transaction transfer to be incomplete. In turn, the interactive helper assertion generator 135 will receive a waveform and/or text listing from the payload analyzer showing how the transactions maybe be dropped. The interactive helper assertion generator may then present the waveform and/or text listing to the user, and receive either a confirmation from the user that the transaction droppage is legal or not. If the transaction droppage is legal, a helper assertion is generated to specify that such condition represents forward progress of the transaction, and, in fact, it also represents a legal "completion" of the transaction. If the transaction droppage is illegal, it represents a bug in the RTL and the user will revise the RTL and restart the verification of deadlock freedom using the revised RTL.

In step 450, tracker related helper assertions are generated based on the state of the trackers. For example, for an interconnect bus using AXI protocol, there may be tracker in ingress module to track the outstanding AR transaction (AR sent but RD not received). There may be similar tracker in egress module to trace the same condition. Between those trackers, there may be payload buffers for both AR and RD channels.

```
Assert -name in1_e1_ar_r_occ {(
    (In1.ar_r_traker.valids[0] && (in1.ar_r_tracker.route[0] == 4'b0001)) +
    (In1.ar_r_traker.valids[1] && (in1.ar_r_tracker.route[1] == 4'b0001)) +
    (In1.ar_r_traker.valids[2] && (in1.ar_r_tracker.route[2] == 4'b0001))
    (In1.ar_r_traker.valids[3] && (in1.ar_r_tracker.route[3] == 4'b0001)) +
    (in1.rch.valid_a && (in1.rch.payload_a[31:28] == 4'b0001)) +
    (in1.rch.valid_b && (in1.rch.payload_b[31:28] == 4'b0001)) )
== (
    (e1.arch.valid_a && (e1.arch.payload_a[2:0] == 3'b001)) +
    (e1.arch.valid_b && (e1.arch.payload_b[2:0] == 3'b001)) +
    (e1.ar_r_tracker.valids[0] && (e1.ar_r_tracker.id[0][2:0] == 3'b001)) +
    (e1.ar_r_tracker.valids[1] && (e1.ar_r_tracker.id[1][2:0] == 3'b001)) +
    (e1.ar_r_tracker.valids[2] && (e1.ar_r_tracker.id[2][2:0] == 3'b001)) +
    (e1.ar_r_tracker.valids[3] && (e1.ar_r_tracker.id[4][2:0] == 3'b001)) ) }
```

In the above example, there are two payloads (pipeline stage) in egress module e1 for AR (e1.arch.valid_a and e1.arch.valid_b) before it is sent out on interface. There are two payloads (pipeline stage) in ingress module in1 for RD (in1.rch.valid_a and in1.rch.valid_b) before it is sent out on interface. The egress port e1 is indicated as index 4'b0001 (route==4'b0001 means the transaction will be sent to egress port e1), while the ingress port in1 is indicated as index 3'b001 (id==3'b001 means the transaction is from ingress port in1). Accordingly, the above helper assertion sync up the states of the trackers in ingress module in1 and egress module e1 for AR/RD transactions. The assertion will be duplicated to other ingress module and egress module pairs if the ingress and egress module implementation is symmetric.

Tracker related helper assertions may also be generated by interactive helper assertion generator 135. By providing waveforms and/or text listing corresponding the propagation of one or more transactions from one payload buffer to another, tracker analyzer 115 enables the interactive helper assertion generator 135 to display the logic in the fanout of the control logic, from which a user can interactively select the corresponding tracker signals for the verification tool to generate tracker related helper assertions. The waveform and/or text listing may be provided by the tracker analyzer 115 to show a waveform corresponding to a transaction that successfully exits through a port, such as a completed read operation from command issued through one port to data returned through another port. With the relevant payload data, payload control, register transitions, etc., information received from the payload analyzer 110, and the candidate of the tracker signals received from the tracker analyzer 115, the interactive helper assertion generator 135 presents them as highlights in the waveform display and receive from the user a confirmation of which tracker signal candidates are indeed tracker signals. In response, the verification tool may receive from the user how the tracker signals are related to each other and related to the payload signals. These items received from the user may then be converted into helper assertions.

In step 445, alternatively or additionally, constant related helper assertions may be generated based on propagating constants. To further optimize the process of formal analysis, one embodiment receives RTL configuration to turn off a subset of the ports, and generate helper assertions that captures how various parts of the RTL logic behave when these ports are disabled. It has been observed that most properties, if found to be true in a scaled down RTL, with two or three ports, depending on the protocol, are also true in the original RTL with many ports. And due to symmetry, if a deadlock cannot occur and cause transactions to stop coming out of one port, the same would be true for the other port. However, instead of using a formal engine that understands symmetry reduction, the disclosed embodiments may generate constant helper assertions corresponding to RTL configuration that disables a subset of the ports. These helper assertions are then fed into the formal engine 125.

For example, as previously described concerning the constant analyzer 120, a formal analysis is performed to propagate the constraints regarding how some ports on interface are disabled, and detect which internal logics would be quiet forever, generating helper assertions of the form:

signal_A==1'b0
signal_B==1'b1

As previously described concerning the constant analyzer 120, this analysis may be performed by a ternary simulation on the RTL, resulting in any flop (or internal signals) with a value 0 or 1 indicate that the flop will remain so regardless of the activities in the active ports. And hence, helper assertions can be generated from these flops (or signals). These helper assertions are known to be true without needing further formal analysis, and they can be fed into the formal engine 125 directly as assumptions, allowing the formal engine 125 to focus analysis of the activities on the remaining active ports.

An exemplary algorithm to propagate a "0" in accordance with the function "Propagate Constant 0" may be described as follows: In a first step, assign a value of "x" to all flops as an initial value. In a second set, assert the reset signal, assign a value of "x" to all inputs except those constrained to "0" or "1" as specified by the RTL configuration constraints, and simulate the design with respect to the RTL configuration constraints, until none of the flops change value. And, in a third step, de-assert the reset signal, continue to assign the value of "x" to all inputs except for those constrained to "0" or "1" as specified by the RTL configuration constraints, until none of the flops change value. By doing so, any flop or internal signal with a value of "0" or "1" indicate that the flop will remain so regardless of the activities on the active ports. Another exemplary algorithm "Propagate Constant 1" may, in a first step, receive information in the RTL, describing how the information about destination (egress port) and source (ingress port) are encoded in the transaction. In many cases, the destination is encoded in address and it will be decoded in ingress port and generate a "route" information. For example, a user may input information like {in1.route "4'b0001" "4'b0010"
in2.route "4'b0001" "4'b0010"}

In the user input above, in the ingress module in1, the signal in1.route is decoded result from address, which will have valid values "4'b0001" and "4'b0010", indicating the transaction may only forward to egress ports with index "4'b0001" and "4'b0010". On the other hand, the transaction may never forward to egress ports with index "4'b0100" and "4'b1000". The source or ingress port is normally encoded in ID of the protocol. User may input following.

{in1.id[2:0] "3'b001"
in2.id[2:0] "3'b010"}

In the user input above, in the ingress module in1, the signal in1.id[2:0] is encoded with index of in1 itself with valid value "3'b001" which means the transaction with "id[2:0]==3'b001" comes from ingress port in1. The ingress module in2 may operate in a similar manner. In a second step, a find payload process may be used to find where the tracker/payload can store the resulting information (in1.route, in2.route}, {in1.id[2:0], in2.id[2:0]}. In a third step, generate helper assertion to assert the signal which hold above information to to have valid values specified as described above.

In step 450, a determination whether a proof of the absence of a deadlock condition can be made. For example, the formal engine may apply one or more techniques, such as induction, theorem proving, or design space tunneling to formally analyze the expanded RTL to prove the absence of a deadlock condition. In other embodiments, one or more formal verification techniques may be combined in a manner to suitable to perform the functions of the formal engine 125 as described herein. If a determination that a deadlock condition still exists, the method returns to step 420. Examples of formal verification methods include induction engine, theorem proving, design space tunneling, etc. as described before. In step 460, a proof is generated responsive to a determination of the absence of a deadlock condition in step 450.

SUMMARY

The foregoing description of the disclosed embodiments has been presented for the purpose of illustration; it is not intended to be exhaustive or to limit the present disclosure to the precise forms disclosed. Persons skilled in the relevant art can appreciate that many modifications and variations are possible in light of the above disclosure.

Some portions of this description describe the disclosed embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non-transitory computer-readable medium containing computer program code, which can be executed by a computer processor for performing any or all of the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A computer program product for determining a deadlock condition in a circuit, the computer program product comprising a non-transitory computer-readable storage medium containing computer program code for:
   receiving a circuit design corresponding to the circuit, the circuit design comprising multiple subsystems that includes a plurality of ports;
   receiving a transaction definition associated with at least one of the plurality of ports;
   generating a deadlock property based on the transaction definition;
   analyzing data flow through the circuit design based on the deadlock property;
   generating a helper assertion capturing how the data flows through the circuit design, based on analysis from the analyzing step; and
   checking for an absence of the deadlock condition within the circuit based on the helper assertion.

2. The computer program product of claim 1, wherein the transaction definition includes, when a transaction:
   enters a subsystem interconnect;
   exits the subsystem interconnect; or
   is dropped by the subsystem interconnect.

3. The computer program product of claim 1, wherein the transaction definition includes a latency threshold, the latency threshold describing a longest congested latency for new activity to leave a port.

4. The computer program product of claim 1, wherein the deadlock property captures a maximum latency between a first transaction entering a first port and a second transaction leaving a second port.

5. The computer program product of claim 4, wherein the first and the second transaction are different transactions.

6. The computer program product of claim 1, wherein the deadlock property captures a maximum idle period in which no pending transaction leaves or drops.

7. The computer program product of claim 1, wherein analyzing data flow through the circuit design based on the deadlock property further comprise partitioning the circuit design and performing the analysis on one or more individual partitions.

8. The computer program product of claim 1, wherein analyzing data flow through the circuit design based on the deadlock property further comprises:
    identifying one or more buffers that store payload data; and
    identifying one or more signals that control how data propagates through the one or more buffers.

9. The computer program product of claim 1, wherein analyzing data flow through the circuit design based on the deadlock property further comprises identifying one or more trackers.

10. The computer program product of claim 1, wherein analyzing data flow through the circuit design based on the deadlock property further comprises:
    receiving constraints to keep a subset of ports idle, and
    identifying one or more signals that contain constant values through simulation.

11. The computer program product of claim 1, wherein analyzing data flow through the circuit design based on the deadlock property further comprises:
    receiving constraints to keep a subset of ports idle; and
    identifying illegal route information through payloads and trackers.

12. The computer program product of claim 1, wherein generating the helper assertion comprises generating the helper assertion automatically.

13. The computer program product of claim 1, further comprising responsive to analyzing the data flow through the circuit design, generating a waveform that represents propagation of a transaction, the waveform including one or more indicators that when activated generate subsequent helper assertions.

14. The computer program product of claim 13, wherein an indicator corresponds to a transition type.

15. The computer program product of claim 14, wherein the transition type being at least one of:
    from a valid state to an invalid state; and
    from the invalid state to the valid state.

16. The computer program product of claim 13, wherein an indicator corresponds to where the transaction is stored.

17. The computer program product of claim 13, wherein an indicator corresponds to a manner in which the transaction propagates.

18. The computer program product of claim 13, wherein an indicator corresponds to whether the transaction was received at a destination port.

19. The computer program product of claim 1, further comprising:
    identifying a first subsystem and a second subsystem as being similar subsystems, the first subsystem being associated with a first helper assertion;
    generating a second helper assertion corresponding to the first helper assertion and associated with the second subsystem; and
    checking for an absence of the deadlock condition using the first and the second helper assertions.

20. The computer program product of claim 19, further comprising:
    storing the second helper assertion in an assertion pool responsive to a determination that the second helper assertion is valid; and
    otherwise, requesting confirmation as to whether the second helper assertion is valid.

21. The computer program product of claim 1, further comprising:
    identifying a first payload and a second payload as being two consecutive steps in the data flow, the first payload or a first tracker being associated with a first helper assertion, the first tracker being related to the first payload;
    generating a second helper assertion corresponding to the first helper assertion and associated with the second payload or a second tracker, the second tracker being related to the second payload; and
    checking for an absence of the deadlock condition using the first and the second helper assertions.

22. The computer program product of claim 21, further comprising:
    storing the second helper assertion in an assertion pool responsive to a determination that the second helper assertion is valid; and
    otherwise, requesting confirmation as to whether the second helper assertion is valid.

23. A computer program product of claim 1, wherein analyzing data flow through the circuit design based on the deadlock property further comprises:
    identifying one or more buffers that store payload data;
    identifying one or more signals that control how data propagates through the one or more buffers;
    identifying one or more trackers; and
    generating a waveform that represents propagation of a transaction, the waveform including one or more indicators that when activated generate subsequent helper assertions.

24. The computer program product of claim 23, wherein analyzing data flow through the circuit design based on the deadlock property further comprises:
    identifying a first subsystem and a second subsystem as being similar subsystems, the first subsystem being associated with a first helper assertion;
    generating a second helper assertion corresponding to the first helper assertion and associated with the second subsystem;
    identifying a first payload and a second payload as being two consecutive steps in the data flow, the first payload or a first tracker being associated with a first helper assertion, the first tracker being related to the first payload;
    generating a second helper assertion corresponding to the first helper assertion and associated with the second payload or a second tracker, the second tracker being related to the second payload; and
    checking for an absence of the deadlock condition using the first and the second helper assertions.

25. A computer program product for determining a deadlock condition in a circuit, the computer program product comprising a non-transitory computer-readable storage medium containing computer program code for:
  receiving a circuit design corresponding to the circuit, the circuit design comprising multiple subsystems that includes a plurality of ports;
  receiving a data-transport related property;
  analyzing data flow through the circuit design based on the data-transport property;
  responsive to analyzing the data flow through the circuit design, generating a helper assertion, wherein the helper assertion captures how the data flow through the circuit design; and
  checking for an absence of the data-transport related property within the circuit in conjunction with the helper assertion.

26. The computer program product of claim 25, wherein analyzing data flow through the circuit design based on the data-transport property further comprises:
  identifying one or more buffers that store payload data; and
  identifying one or more signals that control how data propagates through the one or more buffers.

27. The computer program product of claim 25, wherein analyzing data flow through the circuit design based on the data-transport property further comprises identifying one or more trackers.

28. The computer program product of claim 25, wherein analyzing data flow through the circuit design based on the data-transport property further comprises:
  receiving constraints to keep a subset of ports idle, and
  identifying one or more signals that contain constant values through simulation.

29. The computer program product of claim 25, wherein analyzing data flow through the circuit design based on the data-transport property further comprises:
  receiving constraints to keep a subset of ports idle; and
  identifying illegal route information through payloads and trackers.

30. The computer program product of claim 25, wherein generating the helper assertion comprises generating the helper assertion automatically.

31. The computer program product of claim 25, further comprising responsive to analyzing the data flow through the circuit design, generating a waveform that represents propagation of a transaction, the waveform including one or more indicators that when activated generate subsequent helper assertions.

32. The computer program product of claim 31, wherein an indicator corresponds to a manner in which the transaction propagates.

33. The computer program product of claim 31, wherein an indicator corresponds to whether the transaction was received at a destination port.

34. The computer program product of claim 25, further comprising:
  identifying a first subsystem and a second subsystem as being similar subsystems, the first subsystem being associated with a first helper assertion;
  generating a second helper assertion corresponding to the first helper assertion and associated with the second subsystem; and
  checking for an absence of the deadlock condition using the first and the second helper assertions.

35. The computer program product of claim 25, further comprising:
  identifying a first payload and a second payload as being two consecutive steps in the data flow, the first payload or a first tracker being associated with a first helper assertion, the first tracker being related to the first payload;
  generating a second helper assertion corresponding to the first helper assertion and associated with the second payload or a second tracker, the second tracker being related to the second payload; and
  checking for an absence of the deadlock condition using the first and the second helper assertions.

* * * * *